Feb. 2, 1965 W. B. WARREN 3,168,687

PACKAGED SEMICONDUCTOR ASSEMBLIES HAVING EXPOSED ELECTRODES

Filed Dec. 22, 1959

WILLIAM B. WARREN,
INVENTOR

BY Charles S. Haughey
ATTORNEY

United States Patent Office 3,168,687

Patented Feb. 2, 1965

3,168,687
PACKAGED SEMICONDUCTOR ASSEMBLIES HAVING EXPOSED ELECTRODES

William B. Warren, Costa Mesa, Calif., assignor to Hughes Aircraft Company, Culver City, Calif., a corporation of Delaware Filed Dec. 22, 1959, Ser. No. 861,276
5 Claims. (Cl. 317—234)

This invention relates to semiconductor assemblies and more particularly to miniaturized assemblies designed for integration into miniaturized circuit systems.

Miniaturized semiconductor assemblies designed for automatic manufacturing and assembling into circuit systems present a number of special problems and should desirably have certain characteristics. Such assemblies should embody means for externally determining orientation of the devices in the assembly. They should also embody construction materials which may be handled in miniaturized assemblies. Additionally they should be designed for simplified assembly techniques.

Semiconductor assemblies have heretofore been packaged with wire leads extending from one or both ends, and often from a semiconductor device crystal whose greatest dimension is about the diameter of such wire leads. Device packages or assemblies are thus designed as much to support the wire leads as to support and contain a semiconductor crystal.

An object and advantage of the present invention is to provide a semiconductor assembly having electrodes forming opposite and parallel faces of a cylindrical assembly to which external connections may be made. By making such electrodes relatively thin and parallel to the major surfaces of the semiconductor crystal, the crystal package may be of about the diameter of the semiconductor crystal, and shorter axially than across the diameter. This facilitates automatic handling of such assemblies, and makes possible electrical interconnection systems having small bulk, such as circuit board assemblies, which are not feasible when conventional lead wires are provided. The assembly herein disclosed is particularly adapted for use in interconnection systems utilizing films or thin sheets of conductive material instead of conventional wire leads and interconnecting wires. Sheets and films of a thickness of the order of that of the exposed electrodes of the semiconductor assembly are particularly adaptable to making electrically conducting connections thereto with a resulting minimum of volume and weight.

The above and other objects and advantages of this invention will be explained by or be made apparent from the following disclosure and the preferred embodiment of the invention as illustrated therein and in the drawing, in which.

Figure 1:
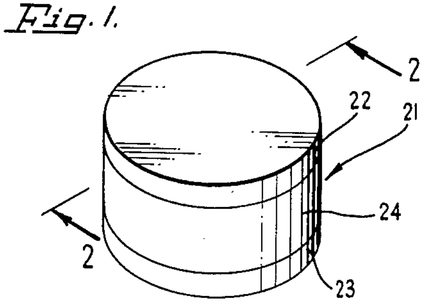
FIG. 1 is a perspective view of a diode according to the present invention.
Figure 2:
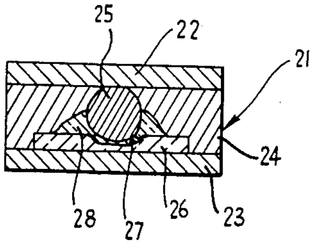
FIG. 2 is a sectional view of the diode of FIG. 1 taken on line 2—2 thereof.

The diode of FIGS. 1 and 2 is preferably made in cylindrical shape as shown and with a diameter of .050″ and a height, or thickness, of .030″.

According to the present invention as illustrated by the diode in the drawing, at least one PN junction is formed on a semiconductor crystal; a small quantity of moisture resistant, high purity insulating material, which is plastic in, or slightly above, the normal operating temperature range of the device, is applied to the exposed edges of the PN junction; and the device is encapsulated between upper and lower electrodes in an insulating material which is elastic in the operating temperature range of the device, and has a softening temperature, if any, above that of the plastic insulating material.

In FIG. 1 there is shown a diode 21 having upper and lower electrodes 22 and 23, respectively, and insulating material 24 therebetween. To provide for proper indexing of the diode 21 the lower electrode 23 is preferably made of a nonmagnetic material such as gold clad molybdenum, and the upper electrode 22 is preferably made from a magnetic material such as gold clad iron, nickel iron, or other ferromagnetic materials.

Figure 5:
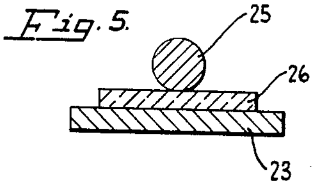
FIGS. 5 through 10 show steps in the process of manufacturing of the diode of FIGS. 1 and 2.
Figure 6:
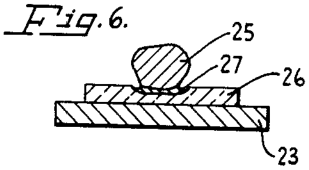

The diode 21 illustrated in FIG. 1 is manufactured by placing a bit 25 of aluminum upon an N-type silicon semiconductor crystal 26 which has preferably been bonded to an electrode 23 as shown in FIG. 5. This assembly is heated to a suitable temperature, preferably about 700° C., to fuse the bit 25 to the surface of the silicon crystal 26. Upon cooling, a regrown region 27 of P-type silicon crystal is formed, as shown in FIG. 6, as a small quantity of aluminum from the bit 25 enters the crystal. A PN junction is thus formed between the regrown region 27 and the main body of the crystal 26. The fused assembly, and in particular the exposed surface of the PN junction, is cleaned in the usual manner, such as by an etchant of equal parts of acetic acid, nitric acid and water. This cleaning, or etching, process produces an under-cut region below the bit 25.

Figure 7:
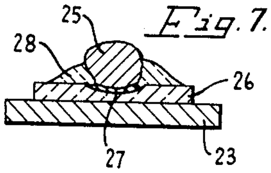

A small quantity of insulating material which is plastic in or slightly above the normal operating temperature range of the desired diode is then placed on the crystal 26 at the surface of the PN junction formed thereon. For this material it is preferred to use a high purity, low melting temperature glass 28 as shown in FIG. 7, such as 24% arsenic, 67% sulphur and 9% iodine nominal composition, with impurities of sodium, manganese, silicon, copper and iron of the order of 25 parts per million by spectrographic analysis. A wide variety of suitable low melting glasses is commercially available, and these are generally characterized by high fluidity at relatively low temperature, such as below 400° C., which makes them ideally suitable for coating exposed edges of PN junctions. Such glasses also include arsenic, sulfur and selenium; arsenic, sulfur and thallium; and other arsenic, sulfur and iodine glasses. The glass purity must be of the order of that of the semiconductor crystal to avoid surface contamination of the PN junction. The low melting glass 28 may be flowed onto the PN junction surface of the crystal at 300° C., to form the structure of FIG. 7. It is preferred to utilize gold clad molybdenum for the electrode 23 to provide a nonmagnetic electrode which is easily bonded to the silicon crystal.

Figures 8, 9:
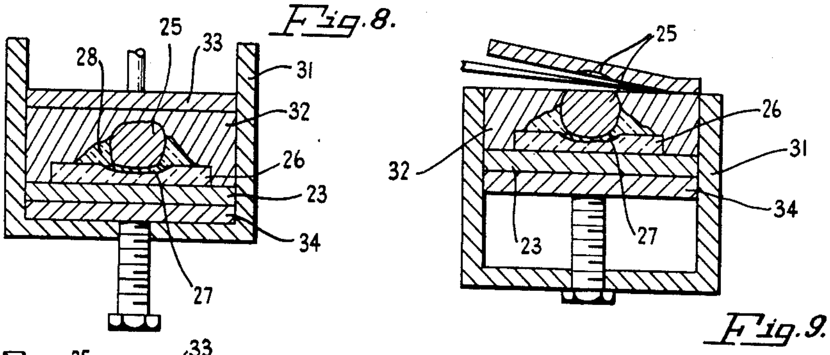

The assembled lower electrode 23 and the P-N junction device bonded thereto is then placed in a recess within a press 31, as shown in FIG. 8, and a quantity of insulating material 32 is then added to the recess to cover the device. For this insulating material it is preferred to use one of the high purity fluorocarbons, or polyfluorocarbons, which may be formed under high pressure and becomes substantially elastic at the ordinary operating temperatures of the semiconductor device. Such fluorocarbons are commercially available under trade names of Kel-F, Genetron, and Teflon. After the fluorocarbon 32 has been pressed into the recesses of the press 31 by a ram 33, a movable base 34 at the bottom of the recess is raised to a predetermined height as shown in FIG. 9 to force a portion of the fluorocarbon material 32 above the recess. This portion is then removed by shaving, grinding, or other suitable means. The bit 25 has been selected and processed in such a fashion as to extend beyond the level at which the material 32 is thus shaved.

This provides a point of attachment for any electrode through the bit 25 to the regrown region 27 of the crystal.

Figure 10:
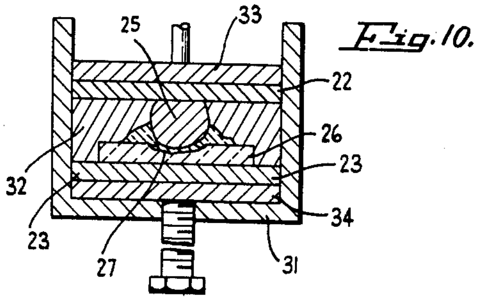

As shown in FIG. 10, the movable base 34 is lowered to the bottom of the recess in the press 31, and upper electrode 22, which is preferably made of a magnetic material, is inserted into the recess and mechanically and electrically connected to the upper surface of the insulating material 32 and the bit 25. This may be done by interposing between the surfaces to be connected an epoxy bonding material containing electrically conductive metallic flakes such as gold, and applying pressure to the upper surface of the electrode 22 by the ram 33. While it is necessary for the upper electrode 22 to be electrically connected to the bit 25, it is also desirable for the insulating material 32 to be bonded to the upper electrode primarily for stability in mechanical handling and to provide protection to the crystal from impurities and ambient atmosphere.

Obtaining a mechanical attachment of the upper electrode to the fluorocarbon material has heretofore presented considerable difficulty. Special surface treatments have been applied to fluorocarbons, including polyfluorocarbons, to prepare them for bonding. This introduces extra process steps and increases possibilities of adding unwanted impurities to the semiconductor. An alternate method for bonding the upper electrode 22 to the bit 25 and the fluorocarbon insulating material is to first coat the electrode 22 with gold, and then with tin, as by vapor deposition or plating techniques. Subsequently the upper surface of the shaved insulating material and aluminum-silicon euetctic material 25 is contacted by the electrode and heated to above the gold-tin eutectic temperature. The gold-tin bonds to the bit 25 and also to the fluorocarbon, forming a stable physical bond to the fluorocarbon as well as to the bit 25.

The final diode structure produced has heretofore been explained and is shown in FIG. 2 in section, with the low melting glass 28 protecting the PN junction surface and with the insulating material 32 surrounding the low melting glass. To provide suitable moisture resistance in the encapsulation, the high purity low melting glass has been chosen to protect the PN junction. Many such low melting glases are presently available, as before noted, and have in common the properties of good adherence to silicon, and other semiconductor crystals, resistance to penetration of moisture, very low softening and flow temperatures, and a property of absorbing impurities from a semiconductor crystal surface. To protect and contain the low melting glass 28, an insulating material is chosen which becomes substantially elastic at normal operating device temperatures. The fluorocarbon series of insulating materials is especially suitable for this purpose.

Figure 3:
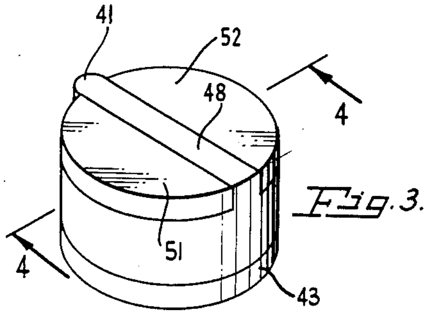
FIG. 3 is a perspective view of a transistor according to the present invention.
Figure 4:
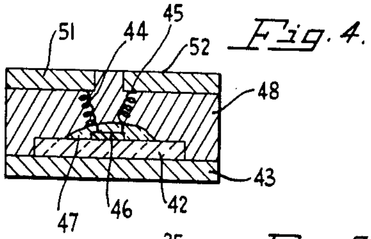
FIG. 4 is a sectional view of the transistor of FIG. 3 taken on line 4—4 thereof.

A transistor as shown in FIGS. 3 and 4 may also be produced according to this invention and in about the same size as the diode excepting that it is preferred to produce indexing tab 41 in the transistor encapsulation. As better shown in FIG. 4, a silicon semiconductor crystal 42 is bonded to a lower electrode 43, preferably non-magnetic material, and a mesa type junction transistor structure is formed on the crystal. Leads 44 and 45 are attached to the mesa 46 and a low melting glass 47 is applied around the junction areas in the manner hereinabove described for the diode 21. Insulating material 48 is then added, as with the diode, except that the leads 44 and 45 extend upwardly through the insulating material. It is preferred to coil or angle the leads 44 and 45 for reasons hereinafter appearing. A pair of magnetic upper electrodes 51 and 52 are then bonded to the material 48 after having the surface thereof in the manner as taught for the diode 21. In the process of shaving the insulating material 48, the coiled or angled leads will expose a greater surface for attachment to the respective electrodes than if the electrodes extended vertically through the insulating material. The electrodes 51 and 52 form less than semicircular segments for a substantially circular transistor assembly, so that they were separated by a volume of the insulating material 48. Independent electrical connections may therefore be made through the respective electrodes 51 and 52, and leads 44 and 45, to the mesa structure 46. The other electrical connection to the crystal 42 is made through electrode 43.

The foregoing assemblies produced as hereinbefore described are adaptable to accommodation in miniature circuit board assemblies. By virtue of the dual potting compound system by which the junctions are first protected by a low melting glass, which in turn is contained in a fluorocarbon insulating plastic, semiconductor devices made as herein taught are extremely rugged and reliable.

What is claimed is:

1. A diode semiconductor device package comprisng in combination: first and second spaced electrodes one of which is magnetic and the other of which is nonmagnetic; a semiconductor crystal bonded to said first electrode and in electrically conducting contact therewith; a regrown crystal region on said crystal on the surface thereof opposite said first electrode; an electrical connection connected to said regrown region and connected to said second electrode; an insulating material surrounding the crystal and forming with said electrodes an hermetically sealed package for the crystal.

2. A substantially cylindrical semiconductor device package having an indexing tab extending axially along the surface thereof; and a plurality of electrodes on at least one planar surface substantially perpendicular to the axis thereof, said electrodes being electrically insulated from each other at the surface of the package whereby the relative position of the indexing tab is a reference from which to distinguish the respective electrodes at said surface.

3. A semiconductor device comprisnig, in combination: a substantially cylindrical package having planar electrode faces at each end of said package one of said electrodes being magnetic and the other being nonmagnetic; an insulating material forming a surface of said package between said electrode faces; and a semiconductor crystal within said package and electrically connected to each of said electrode faces.

4. A semiconductor device according to claim 3 wherein a plurality of electrodes is exposed on at least one of said parallel faces, and insulating material, extending beyond the space between said electrodes to form an indexing lobe on said device.

5. A packaged semiconductor device comprising:
a semiconductor body;
three electrodes connected to said body;
electrically insulating material disposed between said electrodes and encompassing said body; and
said device characterized in that said electrodes are parallel, flat electrodes forming exterior surfaces of said semiconductor device, two of said electrodes being part of a common exterior surface, and electrode material on one said exterior surface being magnetic and electrode material on the other said exterior surface being nonmagnetic.

References Cited in the file of this patent

UNITED STATES PATENTS

| | | |
|---|---|---|
| 1,704,679 | Grondahl | Mar. 5, 1929 |
| 2,777,039 | Thias | Jan. 8, 1957 |
| 2,792,537 | Martin | May 14, 1957 |
| 2,813,326 | Liebowitz | Nov. 19, 1957 |
| 2,836,878 | Shepard | June 3, 1958 |
| 2,869,041 | DeCola | Jan. 13, 1959 |
| 2,894,183 | Fermanian | July 7, 1959 |
| 2,906,930 | Raithel | Sept. 29, 1959 |
| 2,917,684 | Becherer | Dec. 15, 1959 |
| 2,918,612 | Parrish | Dec. 22, 1959 |
| 2,956,214 | Herbst | Oct. 11, 1960 |
| 2,989,669 | Lathrop | June 20, 1961 |
| 3,047,780 | Metz | July 31, 1962 |